United States Patent Office 3,486,903
Patented Dec. 30, 1969

3,486,903
PHOTOPOLYMERIZABLE COMPOSITIONS AND THEIR USE

Herbert Henkler, Darmstadt, Hans Wilhelm, Josef Georg Floss, and Hugo Strehler, Ludwigshafen (Rhine), and Rudolf Brodt, Weinheim, Bergstrasse, Germany, assignors to Badische Anilin- & Soda-Fabrik Aktiengesellschaft, Ludwigshafen (Rhine), Germany
No Drawing. Filed Sept. 6, 1966, Ser. No. 577,177
Claims priority, application Germany, Sept. 8, 1965, 1,447,931
Int. Cl. G03c *1/70;* C08g *41/04*
U.S. Cl. 96—115 4 Claims

ABSTRACT OF THE DISCLOSURE

An improved photopolymerizable composition comprising (1) a mixture of a soluble linear synthetic polyamide and an addition-polymerizable monomer containing at least two ethylenic double bonds and (2) a small amount of a compatible carboxylic anhydride, and a process for the production of printing plates using the said composition.

The invention relates to improved photopolymerizable compositions of soluble polyamides and addition-polymerizable monomers and a process for the production of printing reliefs from these improved compositions.

It is known that relief printing plates can be prepared by exposing to light through a negative or positive a plate, sheet or film of a mixture of a cellulose derivative, an unsaturated monomer having more than one polymerizable double bond and a photoinitiator and then removing the unexposed areas with a suitable solvent down to the desired depth of relief. These relief printing plates are suitable for relief printing and dry offset printing (indirect relief printing). Relief plates of this type are not always sufficiently resistant to abrasion and are difficult to make reproducibly. Moreover they have a high brittleness which is undesired in practice.

It is also known that plates, sheets or films of mixtures of linear saturated synthetic polyamides, monomers having at least two double bonds and photoinitiators can be used for the production of relief printing plates. If the monomers be used in the weight ratio of 1 to 25% with reference to the whole mixture, the relief plates obtained after exposure to light through an image bearing transparency (negative or positive) followed by development with conventional solvents for the polyamide have a sensitivity to light and sharpness of image which is not always satisfactory. On the other hand if an attempt is made to add the monomers in higher concentrations, for example more than 20%, the problem is encountered that such amounts do not dissolve completely in the polyamides and therefore result in cloudiness, bleeding and a lack of homogeneity in the plates.

The compatibility of the polyamides with the monomers has therefore been improved by using polyamides which have first been methylolated followed by etherification of the methylol groups in the polyamide molecules. When using such mixtures there is a risk that undesired cross-linking by the methylol groups can take place prematurely during the production of the plates, films or sheets. Moreover the plates, films and sheets have little stability in storage.

In some cases the inadequate compatibility of the monomers with the polyamides may be improved by adding assistants, such as plasticizers. Since the assistants are in many cases of low efficiency, it is necessary to ue relatively large amount thereof.

It is an object of this invention to provide improved photopolymerizable compositions of polyamides and polymerizable monomers which have an improved compatibility of the monomers with the polyamides, which show no bleeding and which are homogeneous even with a high content of monomers. Another object of the invention is to provide compositions of this type which have a high sensitivity to light and are particularly useful in making printing reliefs. It is a further object of this invention to provide improved relief printing plates which are hard and tough and have an excellent sharpness of image. It is another object of the invention to provide a process for the production of these improved printing reliefs.

We have now found that these objects can be achieved with compositions consisting essentially of from 50 to 90% by weight of a soluble linear synthetic polyamide containing as an integral part of the polymer chain recurring amido groups and 10 to 50% by weight of at least one addition-polymerizable monomer containing at least two non-conjugated ethylenic double bonds or a mixture of said monomer with an addition-polymerizable monomer containing one ethylenic double bond, such monomers being compatible to the extent of at least 30% by weight with the polyamide, in which about 0.05 to 8% by weight of the composition of at least one compatible carboxylic anhydride has been dispersed. If necessary, 0.01 to 10% by weight of the composition of an addition polymerization initiator capable of being activated by actinic light may be dispersed in said composition. It has further been found that improved printing reliefs can be produced from plates, films or sheets of compositions of said polyamides, monomers, carboxylic anhydrides and, if necessary, initiator in the given amounts by exposing them through an image-bearing transparency (positive or negative) to actinic light until the monomers in the exposed areas are substantially completely polymerized, and removing in the desired depth the unexposed areas of the plates, films or sheets by means of a solvent for the polyamide/monomer composition.

The resultant printing reliefs have an excellent sharpness of image, a high impact strength and very long press wear. It was surprising that the addition of carboxylic anhydrides to the compositions of the polyamides and monomers results in a substantial improvement of both the compositions and also the quality of the printing reliefs produced therefrom. Thus, for example, there is a considerable improvement in the compatibility of the monomers with the polyamides so that it is possible to achieve a higher content of monomers. Moreover, the anhydrides surprisingly exert a sensitizing effect on the system so that the exposure times of the plates or similar elements to actinic light in order to polymerize the monomers in the exposed areas can be shortened or else light sources of lower energy can be used.

Particularly suitable organic carboxylic anhydrides are compatible compounds having at least one carboxylic anhydride group and otherwise hydrocarbon structure, especially those radicals identified as aliphatic hydrocarbons and hydrocarbons of the benzene series, particularly hydrocarbons having 2 to 18 carbon atoms. The expression "aliphatic" is understood to comprise radicals of linear and branched aliphatic hydrocarbons and cycloaliphatic hydrocarbons. The expression "carboxylic anhydride groups" means the grouping —CO—O—CO—. Particularly suitable carboxylic anhydrides are those which contain 2 to 8 carbon atoms in the hydrocarbon radical per —CO—O—CO— group. The hydrocarbon radicals in the carboxylic anhydride may be saturated or unsaturated. The normally liquid or solid carboxylic anhydrides can be the anhydrides of organic aliphatic or monocarboxylic acids, particularly of aliphatic monocarboxylic acids having 2 to 10, preferably 2 to 6 carbon atoms, dicarboxylic acids, particularly of aliphatic and aromatic dicarboxylic acids having 4 to 8 carbon atoms, or polycarboxylic acids, particularly aliphatic and aromatic polycarboxylic acids having 6 to 14 carbon atoms. Mixed anhydrides of different carboxylic acids are also suitable.

Examples of suitable carboxylic anhydrides are acetic anhydride, propionic anhydride, butyric anhydride, pentanoic anhydride, hexanoic anhydride, 2-methylhexanoic anhydride, octanoic anhydride, acrylic anhydride, methacrylic anhydride, crotonic anhydride, 3-butenoic, 6-heptenoic anhydride, propiolic anhydride, cyclobutane carboxylic anhydride, cyclohexane carboxylic anhydride, benzoic anhydride, O-toluic anhydride, maleic anhydride, succinic anhydride, glutaric anhydride, β- and δ-sebacic anhydride, glutaconic anhydride, 1,2-cyclohexandicarboxylic anhydride, tetrahydrophthalic anhydride, dihydrophthalic anhydride, phthalic anhydride, 1,2,3,4,-cyclohexanetetracarboxylic dianhydride and pyromellitic anhydride. Examples of mixed anhydrides are the anhydrides of acetic acid and propionic acid, the anhydride of acetic acid and acrylic acid, the anhydride of propionic acid and cyclohexanecarboxylic acid or the anhydride of butyric acid and benzoic acid. The structure of the radicals combined with the anhydride group generally has only a slight influence on the efficiency of the carboxylic anhydride. Therefore, one skilled in the art will be able to substitute other equivalent substituted carboxylic anhydrides. For the purpose of this invention, it is essential to incorporate a compound which has one or more carboxylic anhydride groups and to employ a carboxylic anhydride which is compatible with the composition of the polyamide and monomer components. Although carboxylic anhydrides having a molecular weight below 500 are preferred, compatible, preferably soluble polymeric carboxylic anhydrides of higher molecular weight can also be added to the linear polyamide/monomer compositions. Especially suitable are the polymeric anhydrides of aliphatic dicarboxylic acids having about 6 to 16 carbon atoms such as adipic acid, pimelic acid, suberic acid, azelaic acid and sebacic acid. Examples are polymeric adipic anhydride (softening range 70 to 85° C.), α-sebacic anhydride (molecular weight about 5,000) and ω-sebacic anhydride (molecular weight about 15,000). These polymeric anhydrides can be prepared by the methods known in the art (see e.g. Houben-Weyl, Methoden der organischen Chemie, 4th edition, Stuttgart, 1963, volume 14/2, pages 631 to 633). Mixtures of the low molecular carboxylic anhydrides with each other, with mixed anhydrides and with polymeric anhydrides can also be added to the polyamide/monomer compositions.

In accordance with this invention the carboxylic anhydrides are added to the linear polyamide/monomer compositions in an amount of about 0.05% to 8% by weight of the linear polyamide/monomer mixture, and amounts of 0.1 to 5% by weight are preferred. The carboxylic anhydrides can be incorporated into the polyamide/monomer mixture by conventional methods. For example, they can be added at any stage during the production of plates, films or sheets from the polyamide and the monomer. It is preferred to add them in substance or in solution to the mixture of the polyamide and monomer in dissolved, molten or other finely divided form, whereupon the plates can be cast, pressed, extruded or rolled. In some cases it is possible for plates which have already been prepared from mixtures of the polyamide and monomer to be treated subsequently with the carboxylic anhydrides in dissolved or other finely divided form.

By soluble linear synthetic polyamide is meant a solid polyamide which is soluble at least to the extent of 20%, particularly 60% by weight in a conventional solvent. The preferred polyamides shall have an instrinsic viscosity of at least 0.4 and contain a plurality of recurring amido groups as an integral part of the chain of the molecule. Preparation of the polyamides is for example described in Houben-Weyl, Methoden der organischen Chemie, 4th edition, Stuttgart 1963, volume 14/2 and in the literature there cited.

Preferred suitable linear polyamides for the compositions are interpolyamides which are soluable in conventional solvents or mixtures of solvents, such as in lower aliphatic alcohols, e.g. methanol, ethanol, isopropanol, butanol, alcoholwater mixtures, lower aliphatic ketones such as acetone or methyl ethyl ketone, aromatic hydrocarbons of the benzene series, such as benzene or toluene or mixtures of benzene, lower aliphatic alcohols and water. suitable interpolyamides can be prepared by conventional methods by polycondensation or activated anionic polymerization of at least two lactams having seven to thirteen ring members. Examples of lactams are caprolactam, oenantholactam, capryllactam, laurolactam or corresponding C-substituted lactams, such as α-methyl-ε-caprolactam, ε-ethyl-ε-caprolactam or δ-ethyl-oenantholactam. The aminocarboxylic acids on which these lactams are based can be polycondensed instead of the lactams. Other suitable interpolyamides are the polycondensation products of salts of the type diamine/dicarboxylic acid which have been prepared from at least three polyamide-forming components. Examples of very suitable conventional dicarboxylic acids and diamines for the preparation of interpolyamides by polycondensation are aliphatic dicarboxylic acids having 6 to 18 carbon atoms, such as adipic acid, suberic acid, sebacic acid, ω,ω′-nonane dicarboxylic acid, dodecane dicarboxylic acid and equivalent substitution products, such as α,α-diethyladipic acid, α-ethylsuberic acid or ω,ω′-isooctane dicarboxylic acid or mixtures of the same and also dicarboxylic acids having 6 to 18 carbon atoms and containing aliphatic or aromatic ring systems such as 1,3-cyclobutane dicarboxylic acid, 1,4-cyclohexane dicarboxylic acid, terephthalic acid or isophthalic acid; aliphatic diamines having 2-18 carbon atoms such as pentamethylene diamine, hexamethylene diamine, heptamethylene diamine, octamethylene diamine or C-substituted and/or N-substituted derivatives of these amines, such as N-methylhexamethylene diamine, N-ethylhexamethylene diamine, 1,6-diamino-3-methylhexane; cycloaliphatic and aromatic diamines having 4 to 18 carbon atoms, such as 1,4-cyclohexylene diamine, m-phenylene diamine, such as 1,4-cyclohexylene diamine, m-phenylene diamine, m-xylene diamine, and 4,4′ diaminodiphenylmethane. Suitable are further corresponding dicarboxylic acids and diamines in which the carbon-carbon chain between the two carboxylic acid groups or amino groups is interrupted by heteroatoms, particularly —O— and/or —NR— groups, wherein R denotes hydrogen or lower alkyl.

Those interpolyamides are particularly suitable which have been prepared by cocondensation of a mixture of one or more of said lactams and at least one salt of a dicarboxylic acid and diamine, for example by polycondensation of a mixture of ε-caprolactam, hexamethylene diammonium adipate and p,p′-diaminodicyclohexylmethane adipate. Linear synthetic polyamides prepared by polymerization or polycondensation of one of the lactams or of salts of one dicarboxylic acid and one diamine mentioned above are also suitable for the compositions, provided they are soluble in a conventional solvent. They contain preferably more than 5 carbon atoms per amido group in the polymer chain. Examples are described in Houben-Weyl, loc. cit. and the literature there cited.

Suitable monomers for the composition have at least two addition - polymerizable non - conjugated ethylenic double bonds. By "non-conjugated" is meant a monomer which has no conjugated diene, triene or polyene structure as have, for example, butadiene or isoprene. Preferred monomers contain at least one hetero atom and particularly one ester, amide, urethane and/or urea group. Particularly suitable monomers are dihydric and polyhydric alcohols and phenols having 2 to 18 carbon atoms in which at least two hydroxy groups are substituted by an acrylyloxy group ($CH_2$=CH—COO—) and or methacrylyloxy group ($CH_2$=$CCH_3$—COO—) and aliphatic and aromatic diamines or polyamines having 2 to 18 carbon atoms in which at least 2 amino groups are substituted by an acrylamido and/or methacrylamido group and aliphatic and aromatic amines having 2 to 18 carbon atoms bearing at least one hydroxy group in which at least one amino group is substituted by an acrylamino group and/or methacrylamido group and at least one hydroxy group is substituted by an acrylyloxy group and/or methacrylyloxy group.

Examples are methylene-bis-acrylamide, ethylene-bis-acrylamide, propylene-bis-acrylamide, butylene-bis-acrylamide, pentamethylene-bis-acrylamide, hexamethylene-bis-acrylamide, heptamethylene-bis-acrylamide, octamethylene-bis-acrylamide, N,N',N''-tris-acrylamide from diethylene triamine, the corresponding methacrylamides and acrylamides and methacrylamides derived from polyamines and other diamines, said amines having 2 to 18 carbon atoms, which may be branched, contain —O— or —NH— or —NR (R= lower alkyl) groups in the molecule chain or contain cycloaliphatic or aromatic rings. Further examples are ethylene glycol diacrylate, butanediol-(1,4) dimethacrylate, glycerol trimethacrylate, diethylene glycol diacrylate, trimethylolethane triacrylate, pentaerythritol tetraacrylate, 4-acrylamidobutyl acrylate. Monomers which contain urethane or urea groups in addition to the double bonds are also suitable, such as the reaction products of 2 moles of diol monoacrylates or diol methacrylates with 1 mole of a diiscyanate or the reaction products of 2 moles of the monoacrylamides or monomethacrylamides of an aliphatic diamine with 1 mole of a diisocyanate.

Examples are given in the following formulas:

R—$(CH_2)_6$—R    R=NH—CO—O—$(CH_2)_4$—O—CO—CR'=$CH_2$
R'=H, $CH_3$

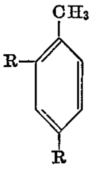

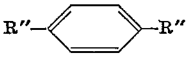

R''=NH—CO—NH—$(CH_2)_2$—NH—CR'=$CH_2$
R'=H, $CH_3$

R''—$(CH_2)_4$—R''

Other suitable monomers containing nitrogen are, for example, triacyloformal, or triallyl cyanurate. The use of monomers having two or more non-conjugated ethylenic double bonds is however not limited to the above selection though monomers having the ethylenic double bond in α- or β-position to a carbonyl group are preferred. They also include other monomers having at least two polymerizable double bonds and preferably containing one hetero atom provided they are compatible to the extent of at least 30% with the polyamide used; this may be determined by a simple small scale test.

In addition to the forgoing monomers, one can also use monomers which contain only one polymerisable ethylenic double bond. Suitable monomers of this type are for example esters of α,β-ethylenically unsaturated acids having 3 to 5 carbon atoms and alkanols having 1 to 8, particularly 1 to 4, carbon atoms, monoesters of these acids and alkanediols having 2 to 6 carbon atoms, nitriles and unsubstituted amides of these acids and substituted amides of these acids with at least one alkyl substituent or an alkoxy methyl substituent having 1 to 8 carbon atoms attached to the nitrogen atom, vinyl esters of aliphatic monocarboxylic acids having 2 to 4 carbon acids, vinyl benzene and vinylbenzenes bearing alkyl substituents having 1 to 4 carbon atoms, and monomers containing N-vinyl groups.

Examples are N-methyl acrylamide, N,N-diethyl methacrylamide, N-cyclohexyl acrylamide, maleic amide, itaconic amide, acrylamide, methacrylamide, N-n-butoxymethyl acrylamide styrene, butanediol monoacrylate, methyl acrylate, methyl methacrylate, ethyl acrylate, ethyl methacrylate, N-vinylcarbazole, N-vinylpyrrolidone, N-vinyl diglycolylimide, N-vinyl succinimide, N-vinyl phthalimide, vinyl acetate, vinyl propionate, dimethyl maleate, cyclohexyl methacrylate and N-vinyl caprolactam.

If mixtures of monomers having at least two double bonds and monomers having only one double bond are used, the monomer mixture should advantageously contain at least 1%, preferably 10%, by weight of the monomer having at least two double bonds and give hard and insoluble solid copolymers.

The monomers are used in an amount of 10 to 50%, preferably 30 to 50% by weight of the mixtures of polyamides and monomers. The resultant mixtures of polyamides, monomers and carboxylic anhydrides are solid and generally non-tacky.

By exposure to actinic light, i.e. light having a high energy content, the monomers in the exposed areas of the composition or plates, films or sheets of the composition form insoluble addition polymers. The exposure time depends on the type of monomers used, the light sensitivity of the composition and the energy content of the light. The exposure time should be sufficient to cause polymerization of most of the monomers in the upper layer of the exposed areas.

To increase light sensitivity, it is advantageous to add small amounts of an initiator which is capable of initiating and/or accelerating polymerization under the influence of actinic light. Examples of suitable compounds are: vicinal ketaldonyl compounds, for example diacetyl and benzil; α-ketaldonyl alcohols, for example benzoin and pivaloin; acyloin ethers, for example benzoin methyl ether and benzoin ethyl ether; azonitriles, for example 1,1-azodicyclohexanecarbonitrile, α-hydrocarbon-substituted aromatic acyloins, for example α-methylbenzoin and α-allylbenzoin and substituted and unsubstituted polynuclear quinones, for example 9,10-anthraquinone, 1-chloroanthraquinone, 2-chloroanthraquinone, 2-methylanthraquinone, 1,4-naphthoquinone, 9,10-phenanthrenequinone. These initiators have the advantage that they are thermally inactive up to temperatures of about 85° C. and in some cases even to about 170° C. so that undesired polymerization reactions are avoided during production of the plates, films or sheets and during storage.

The photoinitiators are used in amounts of 0.01 to 10% by weight, preferably 0.01 to 3% by weight, with reference to the mixture of polyamides and monomers.

It has been found that in some cases it is advisable to add to the mixtures small amounts, e.g. 0.01 to 0.1% by weight of the monomers, of inhibitors which prevent thermal polymerization if the processing conditions include temperatures at which the monomers used tend to undergo thermal polymerization. Stability in storage may also be improved in most cases by adding inhibitors. Such inhibitors are often already contained in the commercially available monomers and are as a rule antioxidants, such as hydroquinone, p-methoxyphenol or ditertiary-butyl-p-cresol.

Plates, films or sheets from compositions of polyamide, monomer and anhydride according to this invention can be prepared by conventional methods, as for example by dissolving the components, mixing the solutions, removing the solvent, followed by pressing, extrusion or rolling of the finely divided mixture. Sheets or films can also be prepared by pouring solutions of the components onto a suitable substrate and removing the solvent.

Actinic light from any source and of any type can be used for exposing the compositions. Conventional high energy lamps, such as carbon arcs, mercury vapor arcs, xenon lamps, argon glow lamps, fluorescent tubes, fluorescent sun-lamps and photographic flood lamps can be used for exposure of the plates.

After the exposure of the plates, films or sheets the unexposed areas are removed by means of a suitable conventional solvent for the polyamide/monomer mixture used. The solvent used should have little action on the hardened exposed areas where the monomers have formed insoluble polymers. Lower aliphatic alcohols, such as methanol, ethanol, isopropanol, aliphatic ketones, such as acetone and methyl ethyl ketone, lower aliphatic esters of lower aliphatic monocarboxylic acids such as ethylacetate and hydrocarbons of the benzene series such as benzene and toluene and mixtures of these solvents are particularly useful.

The solvent may be applied in any convenient manner, as by pouring, immersion or spray. Brushing the plates with a soft brush aids in the removal of the unexposed portion of the composition. The time needed for the removal of the unexposed portion depends on the efficiency of the solvent, the method and the desired depth of the resultant printing reliefs.

The compositions and the process according to this invention are particularly suitable for the production of printing reliefs in the form of plates or the like, and for relief printing, indirect relief printing, dry offset printing and autotype intaglio printing; and if desired the plates, films or sheets may be combined before or after exposure with rigid or flexible supports of metal, wood, paper or plastics.

The invention is illustrated by the following examples. Parts specified in the examples are by weight unless otherwise indicated.

EXAMPLE 1

100 parts of an interpolyamide prepared by conventional cocondensation of 35 parts of hexamethylene diammonium adipate, 35 parts of dicyclohexylmethane-4,4'-diammonium adipate and 30 parts of α-caprolactam is dissolved in 300 parts by volume of methanol at 60° C. A solution of 32 parts of hexamethylene-bis-acrylamide, 20 parts of m-xylylene-bis-acrylamide, 10 parts of triethylene glycol diacrylate, 3 parts of butanediol-(1.4) monoacrylate, 2 parts of maleic anhydride and 0.6 part of benzoin methyl ether in 150 parts by volume of methanol is added to the above solution.

The mixture is freed from solvent in dishes at room temperature and dried for another twenty-four hours in vacuo at 20° C. The dry product is broken up and pressed at 170° C. into a plate having a thickness of 1 mm.

The transparent colorless plate is brought into contact in a vacuum contact frame with a line/half-tone negative and exposed for ten minutes at a distance of 6 cm. to ten fluorescent tubes of the type General Electric F 48 T 12 BL/HO arranged side by side. The exposed plate is then adhered, by means of a double-sided adhesive film, to a metal substrate and the unexposed areas of the free exposed face of the plate are removed by spraying with a mixture of benzene, methanol and water in the ratio 2:7:1. Depending on the pressure of the spray and the temperature of the solvent, the relief formed has a depth of 0.5 to 0.8 mm. after five to seven minutes. The relief is freed from adherent solvent with compressed air and dried. It is used for printing in a relief printing press. Even very fine lines and sharp points are reproduced well and exhibit smooth, sharp-edged relief impages.

EXAMPLE 2

100 parts of the copolyamide described in Example 1 is dissolved in 300 parts by volume of methanol at 60° C. A solution of 32 parts of hexamethylenebisacrylamide, 21 parts of m-xylylene diamine bisacrylamide, 9 parts of triethylene glycol diacrylate, 3 parts of butanediol-(1,4) monoacrylate, 1 part of phthalic anhydride, 0.5 part of benzoin methyl ether and 0.004 part of hydroquinone in 150 parts by volume of methanol is added to the said solution.

The mixture is freed from solvent in dishes at room temperature. The residue is broken up and dried for twenty-four hours at 20° C. in a vacuum drying cabinet. The dry product is ground fine in a mill and pressed at 155° C. into a transparent plate 1 mm. in thickness.

The transparent colorless plate is then brought into intimate contact in a vacuum contact frame with a combined line/half-tone negative and exposed for seven minutes at a distance of 3 cm. to a number of fluorescent tubes of the Philips type arranged closely side by side. The exposed plates are secured by a double-sided adhesive film to an aluminum plate, the exposed surface remaining uncovered. The plate is then sprayed from a number of jets spaced 12 cm. in front of the plate with a mixture of benzene, methanol and water in the ratio 2:7:1 at 30° C. The pressure of the spray is 3 atmospheres. Five to seven minutes later, the plate has been washed out at the unexposed areas to a depth of 0.5 to 0.8 mm. The relief is freed from adherent solvent with compressed air, dried for a short time and then used in a book printing press.

It is distinguished by an outstanding reproduction even of very fine hair lines and half-tone points.

We claim:

1. An improved photopolymerizable composition consisting essentially of (1) a mixture of:

(A)3 50 to 90% by weight of a linear synthetic polyamide soluble at least to the extent of 20% in conventional solvents and containing as an integral part of the polymer chain recurring amido groups and (B) 10 to 50% by weight of at least one member selected from the class consisting of an addition-polymerizable monomer containing at least two non-conjugated ethylenic double bonds and a mixture of said monomer with an addition-polymerizable monomer containing one ethylenic double bond, said monomers being compatible to the extent of at least 30% by weight with said polyamide; and dispersed in said mixture (2) 0.05 to 8% by weight, based on the total weight of the mixture of (A) and (B), of at least one carboxylic anhydride compatible with said mixture.

2. An improved photopolymerizable composition as claimed in claim 1, which additionally contains 0.01 to 10% by weight, based on the weight of said polyamides and said monomers, of an initiator which is capable of initiating or accelerating addition polymerization of said monomers under the influence of actinic light.

3. An improved photopolymerizable composition as claimed in claim 1, wherein the carboxylic anhydride is maleic anhydride.

4. An improved photopolymerizable composition as claimed in claim 1, wherein the carboxylic anhydride is phthalic anhydride.

References Cited

UNITED STATES PATENTS

| | | | |
|---|---|---|---|
| 2,195,362 | 3/1940 | Ellis | 96—115 X |
| 2,923,673 | 2/1960 | Munger | 96—115 X |
| 2,990,281 | 6/1961 | Printy et al. | 96—115 X |
| 2,997,391 | 8/1961 | Murray et al. | 96—35.1 |
| 3,321,309 | 5/1967 | Reichel | 96—115 X |

GEORGE F. LESMES, Primary Examier

R. E. MARTIN, Assistant Examiner

U.S. Cl. X.R.

260—857

PO-1050
(5/69)

UNITED STATES PATENT OFFICE
CERTIFICATE OF CORRECTION

Patent No. 3,486,903 Dated December 30, 1969

Inventor(s) Herbert Henkler et al

It is certified that error appears in the above-identified patent and that said Letters Patent are hereby corrected as shown below:

Column 1, line 69, "ue" should read --use--.

Column 3, line 10, "3-butenoic" should read --3-butenoic anhydride--.

Column 5, line 45, that portion of the formula reading "R'" should read --R--.

Column 8, line 28, "(A)3" should read --(A)--.

SIGNED AND SEALED
MAY 12 1970

(SEAL)
Attest:

Edward M. Fletcher, Jr.
Attesting Officer

WILLIAM E. SCHUYLER, JR.
Commissioner of Patents